(12) United States Patent
Zhou

(10) Patent No.: US 10,546,912 B2
(45) Date of Patent: Jan. 28, 2020

(54) DISPLAY PANEL AND DISPLAY DEVICE

(71) Applicant: Wuhan China Star Optoelectronics Semiconductor Display Technology Co., Ltd., Wuhan, Hubei (CN)

(72) Inventor: Yang Zhou, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/114,172

(22) Filed: Aug. 27, 2018

(65) Prior Publication Data

US 2019/0326384 A1 Oct. 24, 2019

Related U.S. Application Data

(63) Continuation of application No. PCT/CN2018/087851, filed on May 22, 2018.

(30) Foreign Application Priority Data

Apr. 19, 2018 (CN) .......................... 2018 1 0374841

(51) Int. Cl.
| | |
|---|---|
| *H04K 3/00* | (2006.01) |
| *H01L 27/32* | (2006.01) |
| *H05K 3/32* | (2006.01) |
| *H05K 1/18* | (2006.01) |
| *H01L 23/00* | (2006.01) |

(52) U.S. Cl.
CPC .......... *H01L 27/3281* (2013.01); *H01L 24/09* (2013.01); *H05K 1/189* (2013.01); *H05K 3/323* (2013.01)

(58) Field of Classification Search
CPC ..... H01L 27/3281; H01L 24/09; H05K 1/189; H05K 3/323
See application file for complete search history.

(56) References Cited

U.S. PATENT DOCUMENTS

| | | | |
|---|---|---|---|
| 2016/0037107 A1* | 2/2016 | Sakaguchi | ........ H01L 27/14612 348/294 |
| 2018/0090442 A1 | 3/2018 | Li et al. | |

FOREIGN PATENT DOCUMENTS

| | | |
|---|---|---|
| CN | 104319354 A | 1/2015 |
| CN | 107808863 A | 3/2018 |
| JP | 2002299555 A | 10/2002 |

OTHER PUBLICATIONS

CN 10431919354 A English Translation Published in 2015.*

* cited by examiner

*Primary Examiner* — Pete T Lee

(57) ABSTRACT

The present disclosure provides a display panel and a display device including the display panel. The display panel may include a bonding pad having a bonding pad body, a plurality of first bonding pad units, and a plurality of second bonding pad units; the plurality of first bonding pad units and the plurality of second bonding pad units being arranged on both sides of the bonding pad body; wherein the plurality of first bonding pad and the plurality of second bonding pad units are arranged alternately, to form a boundary with a concave and convex changing. By processing the bonding pad to forming the boundary with the concave and convex changing, an area of an overlap where a peripheral circuit is contacted the display panel may be increased, and an efficiency of a production yield of bonding process may be increased and a cost may be reduced.

15 Claims, 7 Drawing Sheets

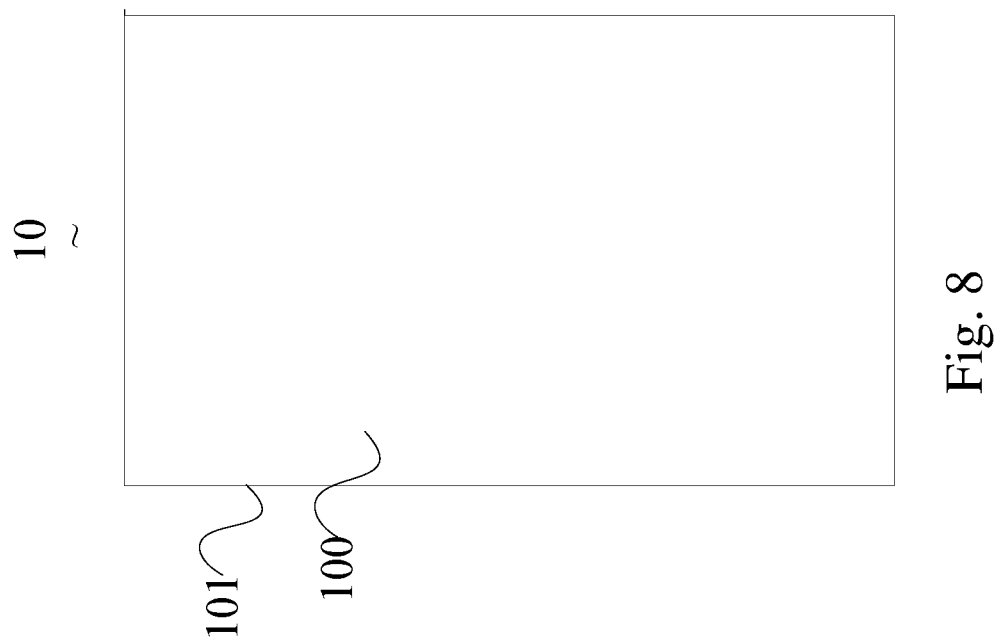

DISPLAY PANEL AND DISPLAY DEVICE

CROSS-REFERENCE TO RELATED APPLICATIONS

The present application is a continuation-application of International (PCT) Patent Application No. PCT/CN2018/087851, filed on May 22, 2018, which claims foreign priority of Chinese Patent Application No. 201810374841.7, filed on Apr. 19, 2018 in the State Intellectual Property Office of China, the entire contents of which are hereby incorporated by reference.

FIELD

The described embodiments relate to display technologies, and more particularly, to a display panel and a display device including the display panel.

BACKGROUND

With the development of electronic products trending to high resolution and portable devices, pitches between pads for connecting display panels and components are becoming smaller and smaller, it brings opportunities and challenges to the design and production of display panel products.

In general, a screen of an organic light-emitting diode (OLED) display panel may be simply divided into an active area (AA) and an outer lead bonding (OLB) portion, and the OLB portion may include a bonding pad portion. A peripheral circuit including the outer leads may include an integrated circuit (IC), a chip on flex (COF), a flexible circuit board (FPC), and a printed circuit board (PCB) or the like, which are bonded to a corresponding bonding pad portion of the display panel via an anisotropic conductive film (ACF). It may achieve a display control of the AA of the display by external signals sending from the peripheral circuit.

The design of a bonding pad in the bonding pad portion mainly considers two aspects for a bonding process. First, an overlap between the peripheral circuit and the display panel; second, a distance between bonding pads. A size of the overlap needs to be large enough to capture more conductive particles, to make an upper and a lower electrodes to be a conductive path, and the distance between two adjacent bonding pads needs to be large enough to prevent from a short circuit occurring between the adjacent bonding pads. However, a shape of the bonding pad and an arrangement of the bonding pad widely used in the bonding pad portion of the OLED display, are in general regular rectangles. When the bonding pad wants to be formed to a small fine pitch design, it will bring greater challenges in display panel processes and designs.

SUMMARY

The present disclosure provides a display panel and a display device. An area of an overlap where a peripheral circuit is contacted the display panel may be increased, and a distance between two bonding pads may be ensured, so that an efficiency of a production yield of bonding process may be increased and a cost may be reduced.

In order to solve the above-mentioned technical problem, a technical solution adopted by the present disclosure is to provide a display device comprising a display panel; the display panel comprising an active area and a non-active area arranged around the active area; the non-active area comprising an outer lead bonding pad portion; the outer lead bonding pad portion comprising a bonding pad portion; a bonding pad arranged in the bonding pad portion; the bonding pad comprising a bonding pad body, a plurality of first bonding pad units, and a plurality of second bonding pad units; the bonding pad body being a shape of a longitudinal rectangle having a first long side and a second long side opposite to the first long side; the first long side and the second long side of the longitudinal rectangle being substantially parallel to a vertical direction; the plurality of first bonding pad units being arranged on the first long side, and the plurality of second bonding pad units being arranged on the second long side; wherein the plurality of first bonding pad units arranged on the first long side and the plurality of second bonding pad units arranged on the second long side, are arranged in the longitudinal direction of longitudinal rectangle, alternately, to form a boundary with a concave and convex changing; wherein a shape of the boundary with the concave and convex changing is one of a square wave shape, a sawtooth wave shape, a triangle wave shape, and a sine wave shape; wherein the display panel further comprises a flexible circuit board; the flexible circuit board is bonded with the bonding pad portion, and the flexible circuit board is directly connected to the bonding pad.

In order to solve the above-mentioned technical problem, another technical solution adopted by the present disclosure is to provide a display panel comprising an active area and a non-active area arranged around the active area; the non-active area comprising an outer lead bonding pad portion; the outer lead bonding pad portion comprising a bonding pad portion; a bonding pad arranged in the bonding pad portion; the bonding pad comprising a bonding pad body, a plurality of first bonding pad units, and a plurality of second bonding pad units; the bonding pad body being a shape of a longitudinal rectangle having a first long side and a second long side opposite to the first long side; the first long side and the second long side of the longitudinal rectangle being substantially parallel to a vertical direction; the plurality of first bonding pad units being arranged on the first long side, and the plurality of second bonding pad units being arranged on the second long side; wherein the plurality of first bonding pad units arranged on the first long side and the plurality of second bonding pad units arranged on the second long side, are arranged in the longitudinal direction of longitudinal rectangle, alternately, to form a boundary with a concave and convex changing.

In order to solve the above-mentioned technical problem, further another technical solution adopted by the present disclosure is to provide a display device comprising a display panel; the display panel comprising an active area and a non-active area arranged around the active area; the non-active area comprising an outer lead bonding pad portion; the outer lead bonding pad portion comprising a bonding pad portion; a bonding pad arranged in the bonding pad portion; the bonding pad comprising a bonding pad body, a plurality of first bonding pad units, and a plurality of second bonding pad units; the bonding pad body being a shape of a longitudinal rectangle having a first long side and a second long side opposite to the first long side; the first long side and the second long side of the longitudinal rectangle being substantially parallel to a vertical direction; the plurality of first bonding pad units being arranged on the first long side, and the plurality of second bonding pad units being arranged on the second long side;

wherein the plurality of first bonding pad units arranged on the first long side and the plurality of second bonding pad units arranged on the second long side, are arranged in the longitudinal direction of longitudinal rectangle, alternately, to form a boundary with a concave and convex changing.

Advantages of the disclosure may follow. As compared with the related art, the present disclosure may provide a display panel and a display device. By processing a bonding pad to form a boundary with a concave and convex changing, an area of an overlap where a peripheral circuit is contacted the display panel may be increased, and a distance between two bonding pads may be ensured, an efficiency of a production yield of bonding process may be increased and a cost may be reduced.

BRIEF DESCRIPTION OF THE DRAWINGS

FIG. 8 is a structural illustration of a display device in accordance with an embodiment in the present disclosure.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

Figure 1:
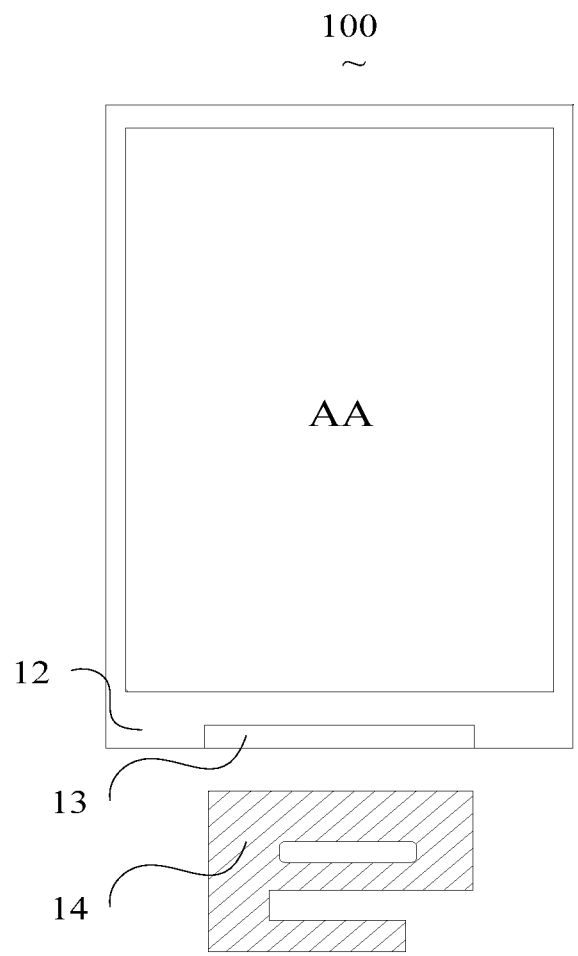
FIG. 1 is a structural illustration of a display panel in accordance with an embodiment in the present disclosure.
Figure 2:
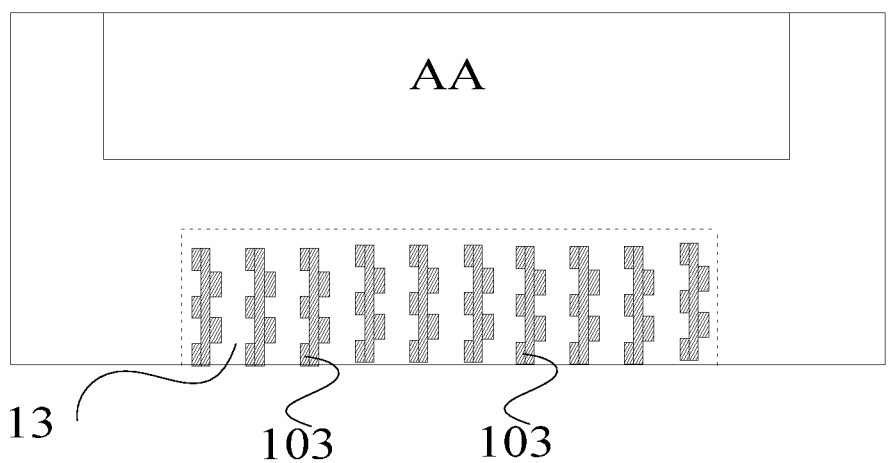
FIG. 2 is a structural illustration of a bonding pad portion in accordance with an embodiment in the present disclosure in FIG. 1.
Figure 3:
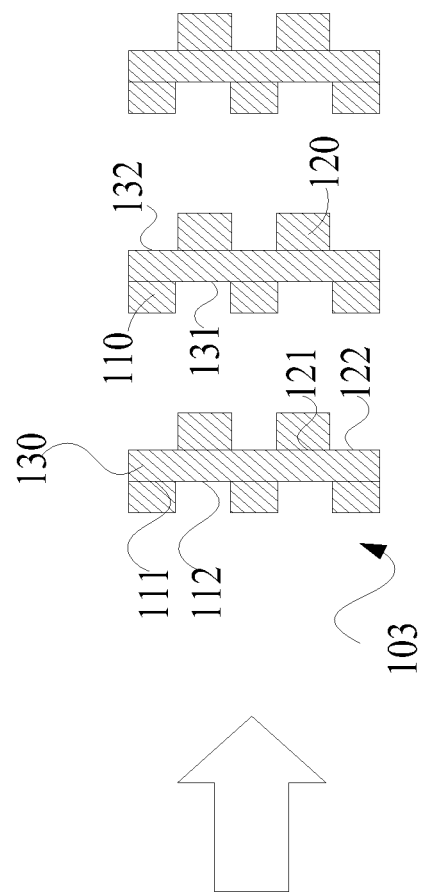
FIG. 3 is a structural illustration of a bonding pad in accordance with an embodiment in the present disclosure in FIG. 1.
Figure 4:
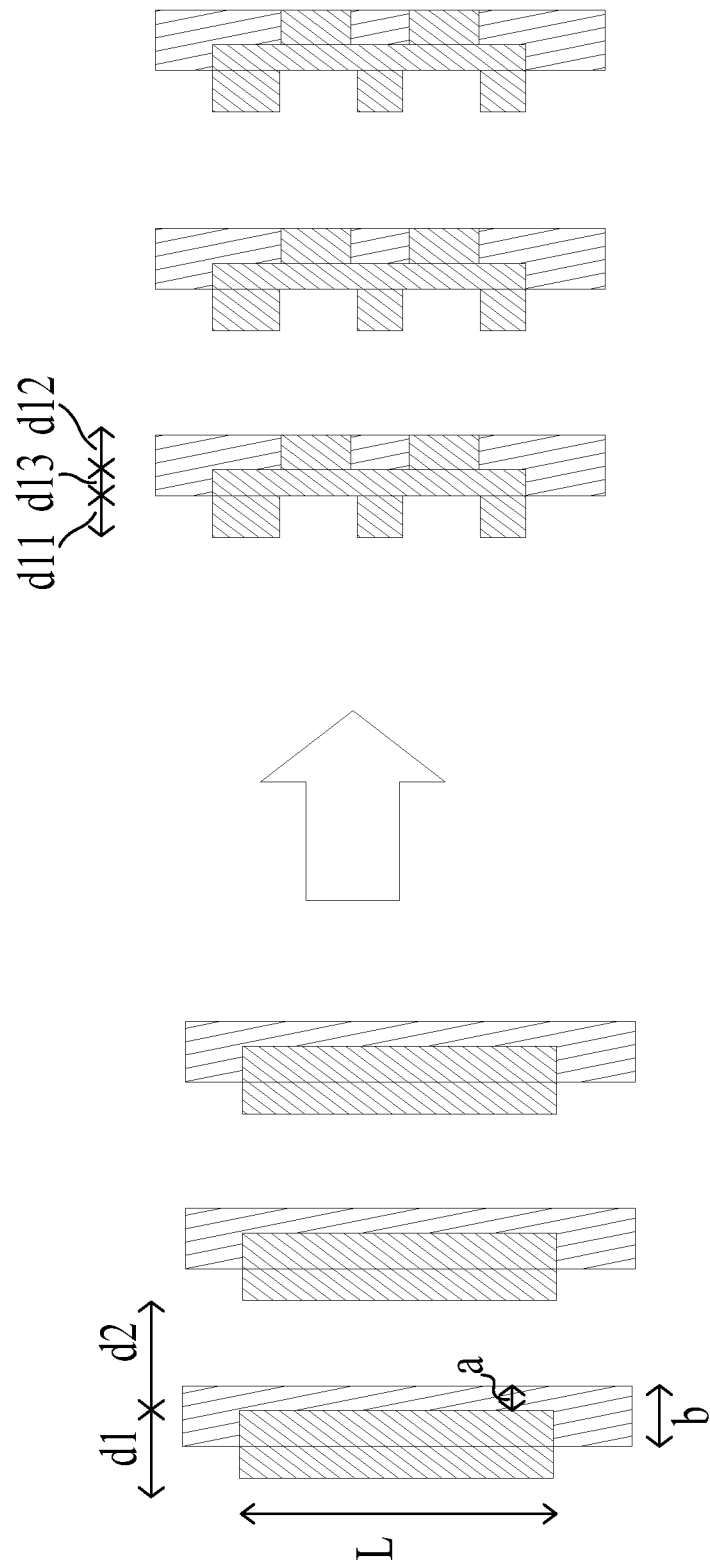
FIG. 4 is a structural illustration of a bonding pad being contacted a peripheral circuit in accordance with an embodiment in the present disclosure in FIG. 1.

Referring to FIGS. 1 to 4, FIG. 1 is a structural illustration of a display panel in accordance with an embodiment in the present disclosure; FIG. 2 is a structural illustration of a bonding pad portion in accordance with an embodiment in the present disclosure in FIG. 1; FIG. 3 is a structural illustration of a bonding pad in accordance with an embodiment in the present disclosure in FIG. 1; FIG. 4 is a structural illustration of a bonding pad being contacted a peripheral circuit in accordance with an embodiment in the present disclosure in FIG. 1.

As shown in FIG. 1 and FIG. 2, the display panel 10 may comprise an active area AA and a non-active area 12 arranged around the active area. The non-active area 12 may include a bonding pad portion 13 for bonding to a peripheral circuit 14.

A plurality of bonding pads 103 may be arranged in the bonding pad portion 13. The bonding pad 103 may include a bonding pad body 130, a plurality of first bonding pad units 110, and a plurality of second bonding pad units 120. The bonding pad body 130 may be a shape of a longitudinal rectangle having a first long side 131 and a second long side 132. The first long side 131 and the second long side 132 of the longitudinal rectangle may be substantially parallel to a vertical direction. The plurality of first bonding pad units 110 may be arranged on the first long side 131, and the plurality of second bonding pad 120 units may be arranged on the second long side 132. The plurality of first bonding pad units 110 arranged on the first long side 131 and the plurality of second bonding pad units 120 arranged on the second long side 132, may be arranged in the longitudinal direction of longitudinal rectangle, alternately, to form a boundary with a concave and convex changing. For a clear description, the bonding pad portion 13 may be arranged below the active area AA, and the first bonding pad unit 110 and the second bonding pad unit 120 may be arranged on the left and right sides of the bonding pad body 130, respectively, but it is not a limitation of the present disclosure.

In the present disclosure, by processing a bonding pad 130 to forming a boundary with a concave and convex changing, an area of an overlap where a peripheral circuit 14 is contacted the display panel 100 may be increased, and a distance between two bonding pads 103 may be ensured, an efficiency of a production yield of bonding process may be increased and a cost may be reduced.

Referring to FIG. 3, the first bonding pad unit 110 may be arranged on a portion 111 opposite to a portion 122 without the second bonding pad unit 120 arranged on the second long side 132, and the second bonding pad unit 120 may arranged on a portion 121 opposite to a portion 112 without the first bonding pad unit 110 arranged on the first long side 131. A number of the first bonding pad unit 110, and a number of the portion 122 without the second bonding pad unit 120 arranged on the second long side 132, may be same. A number of the second bonding pad unit 120, and a number of the portion 112 without the first bonding pad unit 110 arranged on the first long side 131, may be same. The number of the first bonding pad unit 110 and the number of the second bonding pad unit 120 may be same or not, and which may also be odd or even. In the present embodiment, the number of the first bonding pad unit 110 and the number of the second bonding pad unit 120 may be not same, which may be determined by a ratio of a length of the bonding pad body 130 and a length of the first bonding pad unit 110, therefore no additional description is given herebelow. In addition, the portion 111 where the first bonding pad unit 110 is arranged on the first long side 131, and the portion 112 without the first bonding pad unit 110 arranged on the first long side 131, may be same in length; and the first bonding pad unit 110 and the second bonding pad unit 120 may be same in width.

The bonding pad body 13 may include a plurality of the bonding pads 103. A horizontal distance between the first bonding pad unit 110 of one of the plurality of bonding pads 103 and the second bonding pad unit 120 of an bonding pad 103 adjacent to the one of the plurality of bonding pads 103, may be same, so that each horizontal distance between two adjacent bonding pads 103 may be not affected by forming the boundary with the concave and convex changing.

Referring to FIG. 4, compared with a rectangular bonding pad in the related art, take the boundary with the concave and convex changing being a square wave shape in the present disclosure for an example. Assuming that a width of the bonding pad 103 is d1; a distance between two adjacent bonding pads 103 is d2; a width of a pad of the peripheral circuit 14 is b; a width a is a distance that the pad of the peripheral circuit does not contact the bonding pad 103; and a length of the bonding pad 103 is L. Without changing the width d1 and the distance d2 of the bonding pad, in the related art, an area of an overlapping region that the pad of the peripheral circuit 14 contacts the bonding pad 103 is:

$$S1=L*(b-a)$$

In the present disclosure, the area of the overlapping region that the pad of the peripheral circuit 14 contacts the bonding pad 103 may be:

$$S2=L*(b-a)+S\hat{}$$

$S\hat{}$ is an area of a bonding pad unit in one side of the bonding pad body in the bonding pad 103, and the $S\hat{}>0$. As a result, it may be concluded that $S2>S1$, i.e., the area of the overlapping region that the pad of the peripheral circuit 14 contacts the bonding pad 103 may be increased.

Furthermore, assuming that a width of the bonding pad 103 is d1; a width of the bonding pad body 130 is d13; a width of the first bonding pad unit 110 is d11; and a width of the second bonding pad unit 120 is d12. In one embodiment, a range of the width d11 of the bonding pad body 130 may be set to about 20% $d1 \leq d11 \leq 50\%$ d1. Further, a range of the width d11 of the bonding pad body 130 may be set to about 30% $d1 \leq d11 \leq 40\%$ D1.

As an example of an ideal state, when d11=d12=d13=0.5b, i.e., when the width d13 of the bonding pad body is one-third of the width d1 of bonding pad, and when the area of the overlapping region that the pad of the peripheral circuit 14 contacts the bonding pad 103 is only half in an actual state because of an actual bonding process, in the related art, the area of the overlapping region that the pad of the peripheral circuit 14 contacts the bonding pad 103 is:

$$S1=L*(b-0.5b)=0.5Lb$$

In the present disclosure, the area of the overlapping region that the pad of the peripheral circuit 14 contacts the bonding pad 103 may be:

$$S2=L*(b-0.5b)+0.5L*(b-0.5b)=0.75Lb$$

Therefore, in the present disclosure, the area of the overlapping region that the pad of the peripheral circuit 14 contacts the display panel 103 may be increased to about 50%, it may increase the area of the overlapping area where the display panel 100 contacts the peripheral circuit 14. Moreover, because the distance between the boundary with the concave and convex changing in two adjacent bonding pad 103 may be not changed, but the width of the bonding pad 103 may be increased, so that the production yield may be not affected because the area of the overlapping region are too small. Otherwise, when the area of the overlapping region that the pad of the peripheral circuit 14 contacts the display panel 103 is not increased, the width of the bonding pad 103 may be reduced, so that the distance between two adjacent bonding pads may be increased, and a solder pitch may be reduced to increase the resolution.

Further, the display panel 100 may include a flexible circuit board. The flexible circuit board may be bonded with the bonding pad portion 13, and the flexible circuit board may be electrically connected to the bonding pad 103. The display panel 100 may further include an integrated chip, and the integrated chip may be integrated on the flexible circuit board. The flexible circuit board and the bonding pad may be directly connected via an anisotropic conductive film. The anisotropic conductive adhesive film may be made a conductive path by connecting electrodes between the flexible circuit board and the bonding pad 103 using conductive particles. The anisotropic conductive film may have characteristics that it may be continuously processed and has extremely low material loss, and may be a product commonly used in display panels. The flexible circuit board may be a product form of the peripheral circuit, but it is not limited here.

Figure 5:
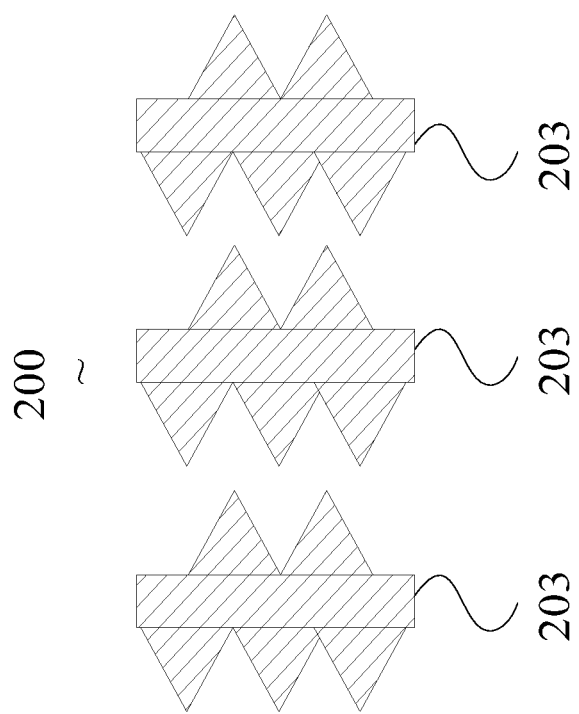
FIG. 5 is a structural illustration of a bonding pad in accordance with another embodiment in the present disclosure.
Figure 6:
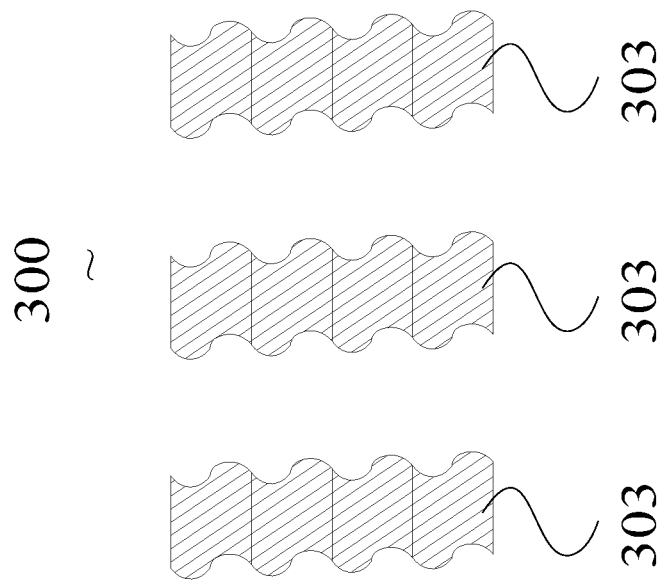
FIG. 6 is a structural illustration of a bonding pad in accordance with another embodiment in the present disclosure.

Referring to FIG. 5 and FIG. 6, FIG. 5 is a structural illustration of a bonding pad in accordance with another embodiment in the present disclosure and FIG. 6 is a structural illustration of a bonding pad in accordance with further another embodiment in the present disclosure.

As show in FIG. 5 and FIG. 6, the display panels of the embodiments may be basically same as those of the above-mentioned embodiment. The difference is that, a shape of the boundary with the concave and convex changing of the bonding pad 203 of the display panel 200 in one embodiment may be a triangle wave shape; a shape of the boundary with the concave and convex changing of the bonding pad 303 of the display panel 300 in one embodiment may be a sine wave shape. The shape of the boundary with the concave and convex changing may be not limited to one of a square wave shape, a sawtooth wave shape, a triangle wave shape, and a sine wave shape, but may also include other regular or irregular concave and convex changing, such as a branch shape, a parallelogram shape, an arrow shape, an hexagon shape, and the like. The shape of the boundary with the concave and convex changing may also be at least one of a square wave shape, a sawtooth wave shape, a triangle wave shape, and a sine wave shape. It may also be a combination of various patterns, and it is not limited here.

Figure 7:
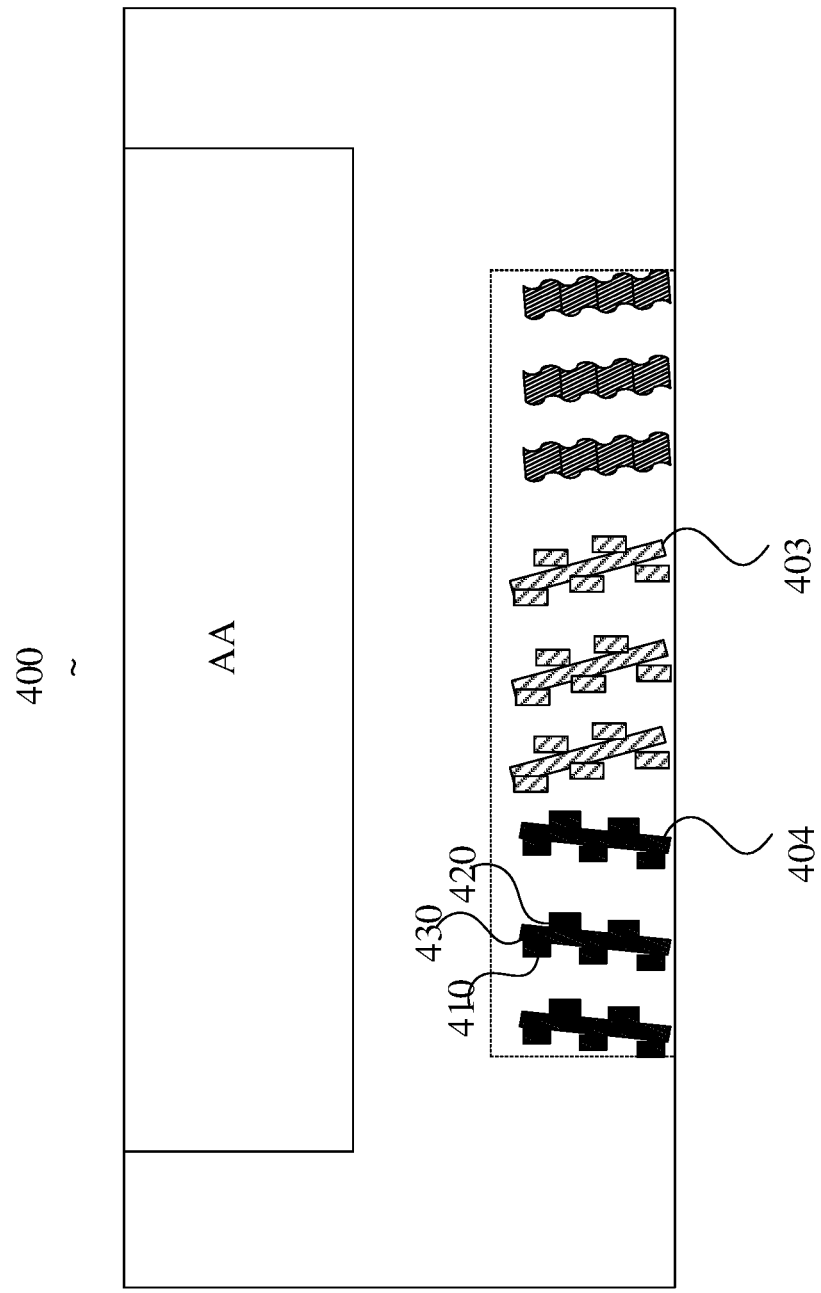
FIG. 7 is a structural illustration of a display panel in accordance with another embodiment in the present disclosure.

Referring to FIG. 7, FIG. 7 is a structural illustration of a display panel in accordance with another embodiment in the present disclosure.

As shown in FIG. 7, the display panel of the embodiment may be basically same as those of the above-mentioned embodiment. The difference is that, the plurality of the bonding pads 403 may include a tilt bonding pad 404 having a tilt angle with the vertical direction. A line connecting to each center point of the first bonding pad unit of the tilt bonding pad 404, a line connecting to each center point of the second bonding pad unit of the tilt bonding pad 404, and a centerline of the bonding pad body 430, may be substantially parallel.

In general, the tilt bonding pad 404 may be arranged on both sides of the bonding pad 403, and the tilt direction thereof is not limited. When the tilt bonding pad 404 has a certain tilt angle with respect to the bonding pad 403, the line connecting to each center point of the first bonding pad unit 410 of the tilt bonding pad 404, the line connecting to each center point of the second bonding pad unit 420 of the tilt bonding pad 404, and the centerline of the bonding pad body 430, may be substantially parallel. According to an actual situation, the first bond pad unit 410 and the second bond pad unit 420 of the tilt bond pad 404 may be tilted at the same time, or may not be tilted at the same time, but may not be sometimes tilted without being tilted.

In general, a display area AA process of the display panel 100 may include: forming an array on a flexible substrate, first. The flexible substrate may be one of polyimide (PI), polyetherimide (PEI), polyphenylene sulfide (PPS), and polyarylate (PAR), or a combination of the above. The flexible substrate may be transparent or non-transparent.

The array may adopt amorphous silicon (a-Si), low temperature polysilicon (LTPS), oxide semiconductor, and so on, to form an active layer. The array may include a buffer, an active layer, a gate insulating layer, a gate layer, an interlayer insulating layer, a source and a drain layer, a flat layer, an anode layer, a pixel definition layer, a support layer, and the like. A preparation method and a process of each layer, may refer to a preparation method and a process for preparing a display panel in the related art, it is not limited here.

In the preparation process of each layer of the display panel 100, a metal layer deposited in the bonding pad portion may be required to be formed simultaneously with the source and the drain layers of the display area AA. The above-mentioned boundary with the concave and convex changing may be formed on the bonding pad portion by exposure, development, etching, and other processes. Using a mask having different image for the exposure, the boundary with the concave and convex changing may be obtained. The shape of the boundary with the concave and convex changing may include, but be not limited to, a square wave shape, a sawtooth wave shape, a triangle wave shape, and a sine wave shape.

Referring to FIG. 8, FIG. 8 is a structural illustration of a display device in accordance with an embodiment in the present disclosure.

As shown in FIG. 8, the display device 10 may include a housing 101 and the above-mentioned display panel 100. The display device 10 in the present disclosure may include a display panel 100. The display panel may be a display panel in any of the above-mentioned embodiments of the present disclosure. A structure of the display panel 100 is described above, therefore no additional description is given herebelow.

The display device 10 provided by the present disclosure may be any product or component having a display function such as a mobile phone, a tablet computer, a television, a display, a notebook, a digital photo frame, a navigator, and the like.

By processing a bonding pad to forming a boundary with a concave and convex changing, an area of an overlap where an peripheral circuit is contacted the display panel may be increased, and a distance between two bonding pads may be ensured, an efficiency of a production yield of bonding process may be increased and a cost may be reduced.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A display device, comprising a display panel, wherein the display panel comprises:
    an active area and a non-active area arranged around the active area; the non-active area comprising a bonding pad portion;
        wherein a bonding pad is arranged in the bonding pad portion; the bonding pad comprising a bonding pad body, a plurality of first bonding pad units, and a plurality of second bonding pad units;
        the bonding pad body being a shape of a longitudinal rectangle having a first long side and a second long side opposite to the first long side; the first long side and the second long side of the longitudinal rectangle being substantially parallel to a vertical direction; the plurality of first bonding pad units being arranged at the first long side and extended from the first long side of the bonding pad body, and the plurality of second bonding pad units being arranged at the second long side and extended from the second long side of the bonding pad body;
        wherein the plurality of first bonding pad units extended from the first long side of the bonding pad body and the plurality of second bonding pad units extended from the second long side of the bonding pad body, are arranged in the longitudinal direction of the longitudinal rectangle, alternately, to form a boundary with a concave and convex changing;
        wherein a shape of the boundary with the concave and convex changing is one of a square wave shape, a sawtooth wave shape, a triangle wave shape, and a sine wave shape;
        wherein the display panel further comprises a flexible circuit board; the flexible circuit board is bonded with the bonding pad portion, and the flexible circuit board is electrically connected to the bonding pad;
        wherein the bonding pad body, the plurality of first bonding pad units, and the plurality of second bonding pad units are uncovered with each other;
        wherein the bonding pad portion comprises a plurality of bonding pads; a horizontal distance between the first bonding pad unit of one of the plurality of bonding pads and the second bonding pad unit of an bonding pad adjacent to the one of the plurality of bonding pads, are same;
        wherein the plurality of the bonding pads comprise a tilt bonding pad having a tilt angle with the vertical direction; a center point of each of the plurality first bonding pad units is located on a first line, a center point of each of the plurality second bonding pad units is located on a second line, and a centerline of the bonding pad body, the first line, and the second line, are substantially parallel.

2. The display device according to claim 1, wherein the first bonding pad unit is arranged on a portion opposite to a portion without the second bonding pad unit arranged on the second long side, and the second bonding pad unit is arranged on a portion opposite to a portion without the first bonding pad unit arranged on the first long side; a number of the first bonding pad unit, and a number of the portion without the second bonding pad unit arranged on the second long side, are same; a number of the second bonding pad unit, and a number of the portion without the first bonding pad unit arranged on the first long side, are same.

3. The display device according to claim 2, wherein the number of the first bonding pad unit, and the number of the portion without the first bonding pad unit arranged on the first long side, are same or not.

4. The display device according to claim 1, wherein the display panel further comprises an integrated chip, and the integrated chip is integrated on the flexible circuit board.

5. The display device according to claim 1, wherein the flexible circuit board and the bonding pad are electrically connected via an anisotropic conductive film.

6. A display panel, comprising an active area and a non-active area arranged around the active area; the non-active area comprising a bonding pad portion;
    a bonding pad arranged in the bonding pad portion; the bonding pad comprising a bonding pad body, a plurality of first bonding pad units, and a plurality of second bonding pad units;
    the bonding pad body being a shape of a longitudinal rectangle having a first long side and a second long side opposite to the first long side; the first long side and the second long side of the longitudinal rectangle being substantially parallel to a vertical direction; the plurality of first bonding pad units being arranged at the first long side and extended from the first long side of the bonding pad body, and the plurality of second bonding pad units being arranged at the second long side and extended from the second long side of the bonding pad body;

wherein the plurality of first bonding pad units extended from the first long side of the bonding pad body and the plurality of second bonding pad units extended from the second long side of the bonding pad body, are arranged in the longitudinal direction of the longitudinal rectangle, alternately, to form a boundary with a concave and convex changing;

wherein the bonding pad body, the plurality of first bonding pad units, and the plurality of second bonding pad units are uncovered with each other;

wherein the bonding pad portion comprises a plurality of bonding pads; a horizontal distance between the first bonding pad unit of one of the plurality of bonding pads and the second bonding pad unit of an bonding pad adjacent to the one of the plurality of bonding pads, are same;

wherein the plurality of the bonding pads comprise a tilt bonding pad having a tilt angle with the vertical direction; a center point of each of the plurality first bonding pad units is located on a first line, a center point of each of the plurality second bonding pad units is located on a second line, and a centerline of the bonding pad body, the first line, and the second line, are substantially parallel.

7. The display panel according to claim 6, wherein a shape of the boundary with the concave and convex changing is one of a square wave shape, a sawtooth wave shape, a triangle wave shape, and a sine wave shape.

8. The display panel according to claim 6, wherein the first bonding pad unit is arranged on a portion opposite to a portion without the second bonding pad unit arranged on the second long side, and the second bonding pad unit is arranged on a portion opposite to a portion without the first bonding pad unit arranged on the first long side; a number of the first bonding pad unit, and a number of the portion without the second bonding pad unit arranged on the second long side, are same; a number of the second bonding pad unit, and a number of the portion without the first bonding pad unit arranged on the first long side, are same.

9. The display panel according to claim 8, wherein the number of the first bonding pad unit, and the number of the portion without the first bonding pad unit arranged on the first long side, are same or not.

10. The display panel according to claim 6, wherein the display panel further comprises a flexible circuit board; the flexible circuit board is bonded with the bonding pad portion, and the flexible circuit board is directly connected to the bonding pad.

11. The display panel according to claim 10, wherein the display panel further comprises an integrated chip, and the integrated chip is integrated on the flexible circuit board.

12. The display panel according to claim 10, wherein the flexible circuit board and the bonding pad are electrically connected via an anisotropic conductive film.

13. A display device, comprising a display panel;
the display panel comprising an active area and a non-active area arranged around the active area; the non-active area comprising a bonding pad portion;
a bonding pad arranged in the bonding pad portion; the bonding pad comprising a bonding pad body, a plurality of first bonding pad units, and a plurality of second bonding pad units;
the bonding pad body being a shape of a longitudinal rectangle having a first long side and a second long side opposite to the first long side; the first long side and the second long side of the longitudinal rectangle being substantially parallel to a vertical direction; the plurality of first bonding pad units being arranged on the first long side, and the plurality of second bonding pad units being arranged on the second long side;

wherein the plurality of first bonding pad units extended from the first long side of the bonding pad body and the plurality of second bonding pad units extended from the second long side of the bonding pad body, are arranged in the longitudinal direction of the longitudinal rectangle, alternately, to form a boundary with a concave and convex changing;

wherein the bonding pad body, the plurality of first bonding pad units, and the plurality of second bonding pad units are uncovered with each other;

wherein the bonding pad portion comprises a plurality of bonding pads; a horizontal distance between the first bonding pad unit of one of the plurality of bonding pads and the second bonding pad unit of an bonding pad adjacent to the one of the plurality of bonding pads, are same;

wherein the plurality of the bonding pads comprise a tilt bonding pad having a tilt angle with the vertical direction; a center point of each of the plurality first bonding pad units is located on a first line, a center point of each of the plurality second bonding pad units is located on a second line, and a centerline of the bonding pad body, the first line, and the second line, are substantially parallel.

14. The display device according to claim 13, wherein a shape of the boundary with the concave and convex changing is one of a square wave shape, a sawtooth wave shape, a triangle wave shape, and a sine wave shape.

15. The display device according to claim 13, wherein the first bonding pad unit is arranged on a portion opposite to a portion without the second bonding pad unit arranged on the second long side, and the second bonding pad unit is arranged on a portion opposite to a portion without the first bonding pad unit arranged on the first long side; a number of the first bonding pad unit, and a number of the portion without the second bonding pad unit arranged on the second long side, are same; a number of the second bonding pad unit, and a number of the portion without the first bonding pad unit arranged on the first long side, are same.

* * * * *